United States Patent
Poire

(10) Patent No.: US 6,917,262 B2
(45) Date of Patent: Jul. 12, 2005

(54) INTEGRATED MICROWAVE FILTER MODULE WITH A COVER BONDED BY STRIPS OF CONDUCTIVE PASTE

(75) Inventor: Philippe Poire, Courbevoie (FR)

(73) Assignee: Alcatel, Paris (FR)

( * ) Notice: Subject to any disclaimer, the term of this patent is extended or adjusted under 35 U.S.C. 154(b) by 364 days.

(21) Appl. No.: 10/116,037

(22) Filed: Apr. 5, 2002

(65) Prior Publication Data

US 2002/0149039 A1 Oct. 17, 2002

(30) Foreign Application Priority Data

Apr. 17, 2001 (EP) .............................. 01440107

(51) Int. Cl.$^7$ .......................... H01P 1/203; H01L 21/58
(52) U.S. Cl. ...................... 333/204; 333/247; 257/664; 257/710; 257/728
(58) Field of Search ............................... 333/247, 204; 257/664, 710, 728

(56) References Cited

U.S. PATENT DOCUMENTS

| | | | |
|---|---|---|---|
| 4,801,905 A | | 1/1989 | Becker |
| 5,394,011 A | * | 2/1995 | Yamamoto et al. ..... 257/710 X |
| 5,436,405 A | | 7/1995 | Hogge, Jr. et al. |
| 5,939,784 A | * | 8/1999 | Glenn ........................ 257/710 |
| 6,121,833 A | | 9/2000 | Rattay et al. |
| 6,175,287 B1 | * | 1/2001 | Lampen et al. ............. 333/247 |

OTHER PUBLICATIONS

Hoffmann Reinmut K: "Integrierte Mikrowellenschaltungen" 1983, Springer Verlag, Berlin Heidelberg, New York Tokyo XP002185126, pp. 61–63.
Patent Abstracts of Japan, vol. 2000, No. 20, Jul. 10, 2001 & JP 2001 077608 A (Toyota Motor Corp), Mar. 23, 2002.
Patent Abstract of Japan, vol. 1997, No. 5, May 30, 1997 & JP 09 023107 A (Nippon Telegr & AMP; Teleph Corp <NTT>), Jan. 21, 1997.

* cited by examiner

*Primary Examiner*—Benny Lee
(74) *Attorney, Agent, or Firm*—Sughrue Mion, PLLC

(57) ABSTRACT

An integrated microwave module comprising a conductive ground plane, a non-conductive substrate on the ground plane, at least two microwave circuits mounted on the substrate, a microstrip line between the microwave circuits mounted on the substrate, and a conductive cover closing the integrated microwave module. The substrate comprises a line of metallized holes along both sides of the microstrip line, and a strip of conductive paste is disposed between the lines of metallized holes and the conductive cover.

10 Claims, 3 Drawing Sheets

INTEGRATED MICROWAVE FILTER MODULE WITH A COVER BONDED BY STRIPS OF CONDUCTIVE PASTE

BACKGROUND OF THE INVENTION

The present invention relates to integrated microwave modules used in radio communication equipment. More particularly, the present invention deals with microwave isolation between different parts of an integrated microwave module to avoid unwanted microwave frequency bands propagation inside the integrated microwave module.

Integrated microwave modules (also referred as Monolithic Microwave Integrated Modules MMICs) include microwave circuits connected together via transmission lines, usually microstrip lines, whose architecture and length should be designed to avoid unwanted oscillations in the microwave integrated circuit.

However, at the frequencies where the integrated microwave circuit is expected to be used, especially for frequencies higher than 1 GHz, the sole appropriate design of the transmission lines is insufficient to guarantee the absence of oscillation and other techniques should be used for this purpose.

A first solution to this problem consists in filling the free space between the integrated circuits and the cover of the integrated microwave module with microwave absorber materials. For example, the covers of the integrated microwave modules are machined to create a groove and microwave absorber is stuck into the groove. The more microwave absorber used, the better is the microwave isolation between the different circuits of the integrated microwave module. However, usual microwave absorbers are narrow band materials that eliminate only a narrow frequency band while the unwanted microwave frequency bands which perturb the behavior of the integrated microwave modules extend beyond the frequency band eliminated by the microwave absorbers. Moreover, the use of good quality microwave absorbers raises significantly the cost of integrated microwave modules.

Another solution is disclosed in U.S. Pat. No. 6,121,833 (assigned to the assignee of the present application) in the case of a high gain microwave amplifier. For avoiding the phenomenon of interfering re-injections between the output and the input of the amplifier, waveguides are provided for in the spaces situated below the cover of the MMIC. The cutoff frequencies of these waveguides is chosen higher than the upper limit of the working passband to be amplified. The free space below the cover is subdivided into waveguides by including, in this space, metal bars constituting the metal walls of the waveguides.

The design of metal bars in the free space requires very high precision tools and increase also the price of the integrated microwave modules.

A particular object of the present invention is to provide an integrated microwave module which comprises efficient microwave isolation means for a lower cost and not requiring additional metal bars to be included below the cover of the integrated microwave module.

Another object of the invention is to provide a method for manufacturing such integrated microwave modules.

SUMMARY OF THE INVENTION

These objects, and others that appear below, are achieved by a integrated microwave module comprising a conductive ground plane, a non-conductive substrate on said ground plane, at least two microwave circuits mounted on said substrate, a transmission line mounted on said substrate between said microwave circuits, and a conductive cover closing said integrated microwave module, wherein:
   said substrate comprises a line of metallized holes along said transmission line on both sides of said transmission line;
   a strip of conductive paste being disposed between said lines of metallized holes and said conductive cover.

These objects are further achieved by a method for manufacturing an integrated microwave module comprising a conductive ground plane, a non-conductive substrate on said ground plane, at least two microwave circuits mounted on said substrate, a transmission line mounted on said substrate between said microwave circuits, a conductive cover, said method comprising the steps of:
   realizing a line of metallized holes along said transmission line on both sides of said transmission line;
   depositing strips of conductive paste on said conductive cover on places to be in contact with said lines of metallized holes, said strip of conductive paste having a predefined thickness;
   disposing said conductive cover on said substrate so that said strips of conductive paste coincide with said lines of metallized holes;
   applying a pressure on said conductive cover against said non-conductive substrate for obtaining a predefined distance between said non conductive substrate and said conductive cover.

According to the present invention, a guiding structure is created enclosing the transmission lines between the different microwave circuits constituting the integrated microwave module. This guiding structure acting as a virtual waveguide is constituted by:
   a line of metallized holes in the non-conductive substrate surmounted by a strip of conductive paste on each side of the transmission line,
   by the conductive cover over the transmission line; and
   by the conductive ground plane under the transmission line.

This guiding structure is preferably a virtual rectangular waveguide whose dimensions (i.e. width and height) are chosen to present a cutoff frequency and to prevent the propagation of unwanted frequency bands above this cutoff frequency.

The present invention has the advantage to easily create a guiding structure in the integrated microwave module without including additional metal walls in the free space below the cover.

Another advantage consists in the easy application of strips of conductive paste on the conductive cover. This operation can be automated without requiring high precision tools.

The guiding structure according to the present invention further presents the advantage to combine the means for sticking the cover over the integrated circuits with the means for providing microwave isolation inside the integrated microwave module.

Further advantageous features of the invention are defined in the dependent claims.

This invention is based on a priority application EP 01 44 0107 which is hereby incorporated by reference.

BRIEF DESCRIPTION OF THE DRAWINGS

Other characteristics and advantages of the invention will appear on reading the following description of a preferred embodiment given by way of non-limiting illustrations, and from the accompanying drawings, in which.

DETAILED DESCRIPTION OF THE INVENTION

Figure 1:
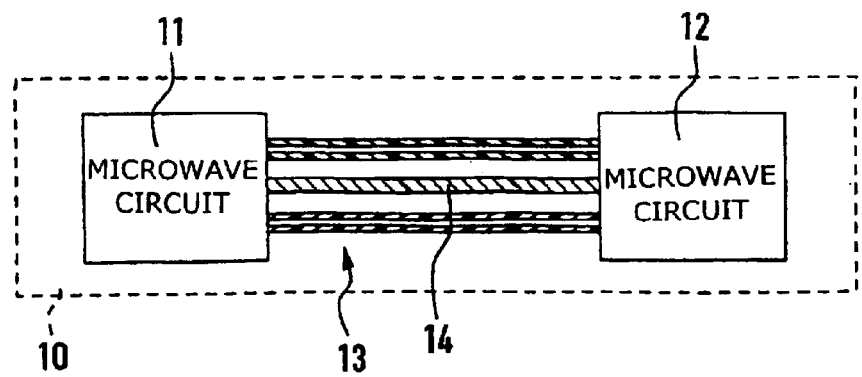
FIG. 1 shows a integrated microwave module according to the present invention.

FIG. 1 shows a diagrammatic top view of an integrated microwave module according to the present invention. It shows a support 10 supporting two microwaves circuits 11, 12. A transmission line 14 is provided for between microwave circuits 11 and 12 for ensuring the propagation of microwaves between the output of microwave circuit 11 to the input of microwave circuit 12. Transmission line 14 is enclosed in a guiding structure 13 according to the present invention which will be described in derail as follows.

The integrated microwave module is closed by a conductive cover not represented on FIG. 1.

Support 10 is preferably composed of conductive ground plane sumounted by a non conductive substrate. Advantageously, the substrate is made of the material RO4003™, a hydrocarbon ceramic, from the company Rogers Corporation (thickness 0.2 mm), the conductive cover and the ground plane being made out of aluminium.

The microwave circuits 11, 12 as well as transmission line 14 are fixed on the substrate. The transmission line is preferably a microstrip line adapted to transmit microwave signals between one microwave circuit 11 and another microwave circuit 12. The microstrip line confines the electromagnetic wave supporting the microwave signal in a precise region of the substrate i.e. along transmission line 14. The passband of microstrip line 14 is adapted to the frequencies of the microwave signal that are expected to propagate between the two microwave circuits. In another embodiment of the invention and in order to select several precise frequency bands out of the passband, the microstrip line can be replaced by a microstrip filter. The present invention will be described as follows in the case of a transmission line constituted by a microstrip line. It will be apparent to a person ordinarily skilled in the art that the invention can also use microstrip filters or any other usual transmission means to link microwave circuits.

The invention is non restricted to an integrated microwave module comprising two integrated circuits linked by a transmission line. The invention concerns also an integrated microwave module comprising a large number of circuits linked with a plurality of transmission lines, a guiding structure according to the present invention enclosing each of the transmission lines. For sake of simplicity the invention will be described in the framework of an integrated microwave circuit as represented on FIG. 1.

Figure 2A:
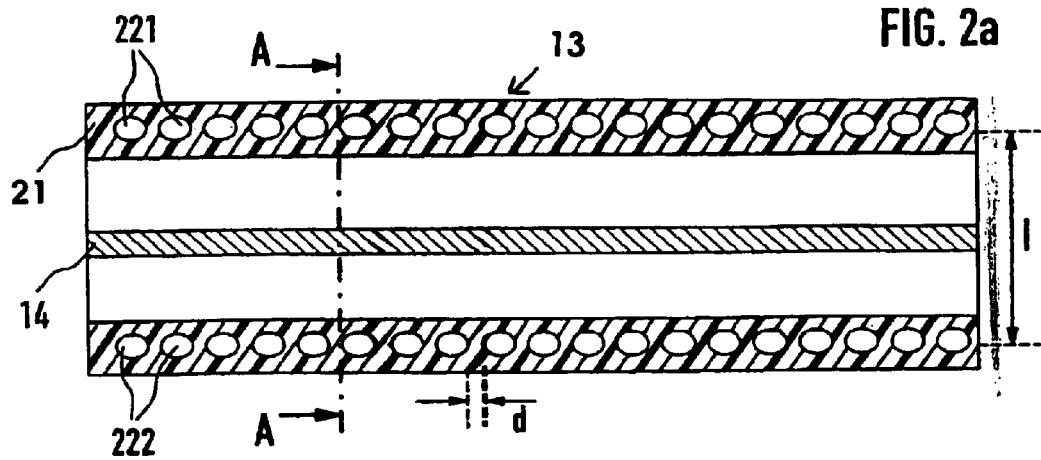
FIGS. 2a, 2b, 2c illustrate several views of the guiding structure according to the present invention.
Figure 2B:
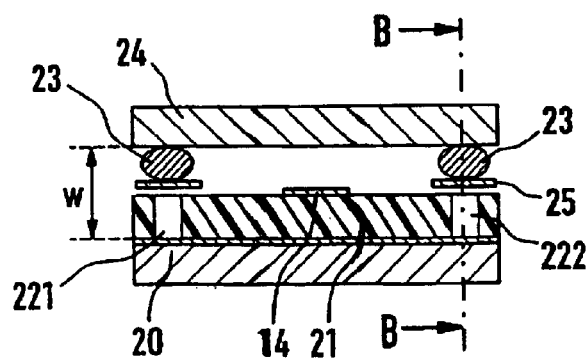
Figure 2C:
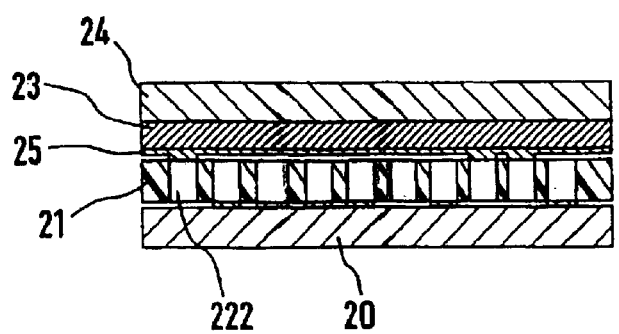

FIGS. 2a, 2b and 2c illustrate several views of guiding strict 13 enclosing transmission line 14 (FIG. 2a). FIG. 2a represents a detailed top elevation view of guiding structure 13. FIG. 2b represents a first cross-sectional view along line A—A of FIG. 2a. FIG. 2c represents a second cross-sectional view along line B—B of FIG. 2b.

FIGS. 2b and 2c show a conductive ground plane 20 surmounted by a substrate 21 supporting transmission line 14 (see FIGS. 2a, 2c) as already known from a prior art solution. FIG. 2a further represents two lines of metallized holes 221, 222 in substrate 21 on both sides of transmission line 14. Preferably, a band of metal 25 (FIGS. 2b and 2c) is provided for on the top of substrate 21 along the lines of metallized holes 221, 222.

As shown in FIG. 2b and FIG. 2c, the metallized holes go through substrate 21 and are in contact with conductive ground plane 20. A strip of conductive paste 23 is deposited on each line of metallized holes 221, 222, and a conductive cover 24, in contact with the strips of conductive paste 23, closes the whole integrated microwave module. An electrical contact is then possible between the following elements: ground plane 20, lines of metallized holes 221, 222, strips conductive paste 23 and conductive cover 24.

Preferably these elements are positioned so as to form a virtual rectangular waveguide enclosing microstrip line 14. As shown in FIG. 2b, conductive cover 24 forms the top of the virtual rectangular waveguide, conductive ground plane 20 forms the bottom of the virtual rectangular waveguide, and the lines of metallized holes 221, 222, surmounted by the strips (23, 23) of conductive paste, form the two side walls of the virtual rectangular waveguide.

Preferably these elements are positioned so as to form a virtual rectangular waveguide enclosing microstrip line 14. As shown in FIG. 2b, conductive cover 24 forms the top of the virtual rectangular waveguide, conductive ground plane 20 forms the bottom of the virtual rectangular waveguide, and the lines of metallized holes 221, 222 surmounted by the strips of conductive paste 231, 232, form the two side walls of the virtual rectangular waveguide.

The role of the virtual waveguide is to prevent the propagation of unwanted frequency bands between one microwave circuit 11 and the other 12 inside the integrated microwave module (i.e. in substrate 21 itself and in the free space between the substrate 21 and conductive cover 24). For this purpose, the geometry of the virtual rectangular waveguide is chosen to present an appropriate cutoff frequency. In the case of a rectangular waveguide, the cutoff frequency depends on the dimension of the cross section of the waveguide i.e., the width w (FIG. 2b) and the length 1 (FIG. 2a) of its cross section).

For example, if width w is equal to 0.7 mm and length 1 is equal to 3 mm, the pass band of the virtual rectangular waveguide extends from 60 GHz to 90 GHz, the cutoff frequency being 60 GHz. If no microstrip line were enclosed in the virtual rectangular waveguide, the latter would behave as a high pass filter preventing the propagation of any frequencies below 60 GHz. The microstrip line allows, despite the virtual rectangular waveguide, the propagation of predefined frequencies in the microstrip line from one microwave circuit to the other. Usually, the passband of the microstrip line is contained between 0 to 30 GHz.

As a consequence, the guiding strict according the invention enables the propagation of selected microwaves frequencies (i.e., the freguency passband of the microstrip line) in the microstrip line, while preventing any microwave frequencies (up to the cutoff frequency of the virtual rectangular waveguide) to propagate in the free space inside the virtual rectangular waveguide.

The width w of the virtual waveguide is equal to the thickness of the substrate 21 plus the thickness of the strip of conductive paste 23. However, in a preferred embodiment of the invention, the thickness of the conductive paste 23 is a little superior to this value. Indeed, by exerting a press on the conductive cover 24, some of the conductive paste 23 enters in the metallized holes 221, 222 improving the electrical contact between the conductive cover 24 and the metallized holes 221, 222 while guaranteeing the width value w.

In order for the guiding strict 13 to effectively play the role of a rectangular waveguide, some further conditions should advantageously be respected. The distance d (FIG. 2a) between the rims of two consecutive holes of the lines of metallized holes 221, 222 should advantageously be chosen in accordance with the cutoff frequency. For example, the distance d should be less than 0.2 mm to ens a lateral shielding up to 50 GHz. The larger the distance between the rims of two consecutive metallized holes, the smaller is the frequency limit up to which shielding is ensured. The diameter of the metallized holes should be smaller than the width of the strips of conductive paste so that the holes are completely covered by the conductive paste. Preferably, for manufacturing purposes, the diameter of the metallized holes is around 0.6 mm.

The invention also relates to a method for manufacturing such integrated microwave module according to the present invention.

Figure 3:
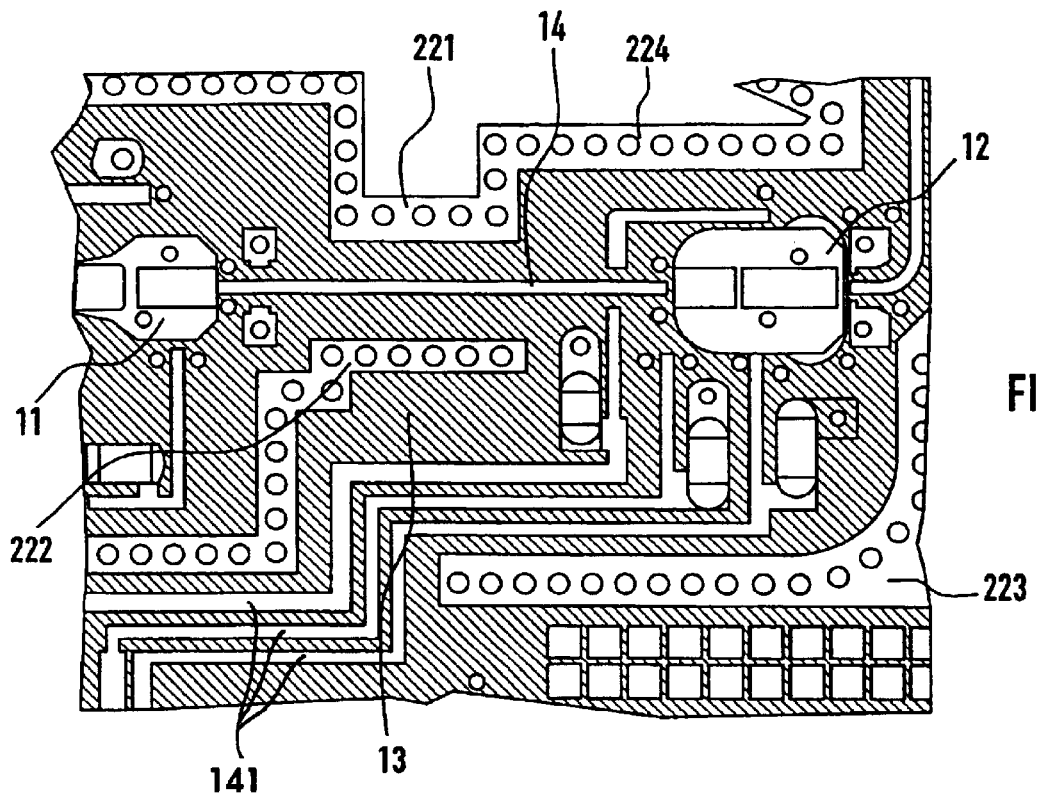
FIG. 3 illustrates a part of an integrated microwave module according to the first step of the manufacturing method

FIG. 3 shows a part of a integrated microwave module after the first step of the method for manufacturing an integrated microwave module. This first step consists in realizing a line of metallized holes along microstrip line 14 on both sides of the microstrip line 14. FIG. 3 shows two microwave circuits 11, 12, the transmission line 14 and lines of inetallized holes 221, 222 belonging to the guiding strict 13 according to the present invention. FIG. 3 shows further transmission lines 141 to another not represented microwave circuit. Further lines of metallized holes 223, 224 are situated all along and around the microwave circuits 11, 12. The technical effect of microwave isolation according to the present invention is only provided for along transmission line 14.

Figure 4:
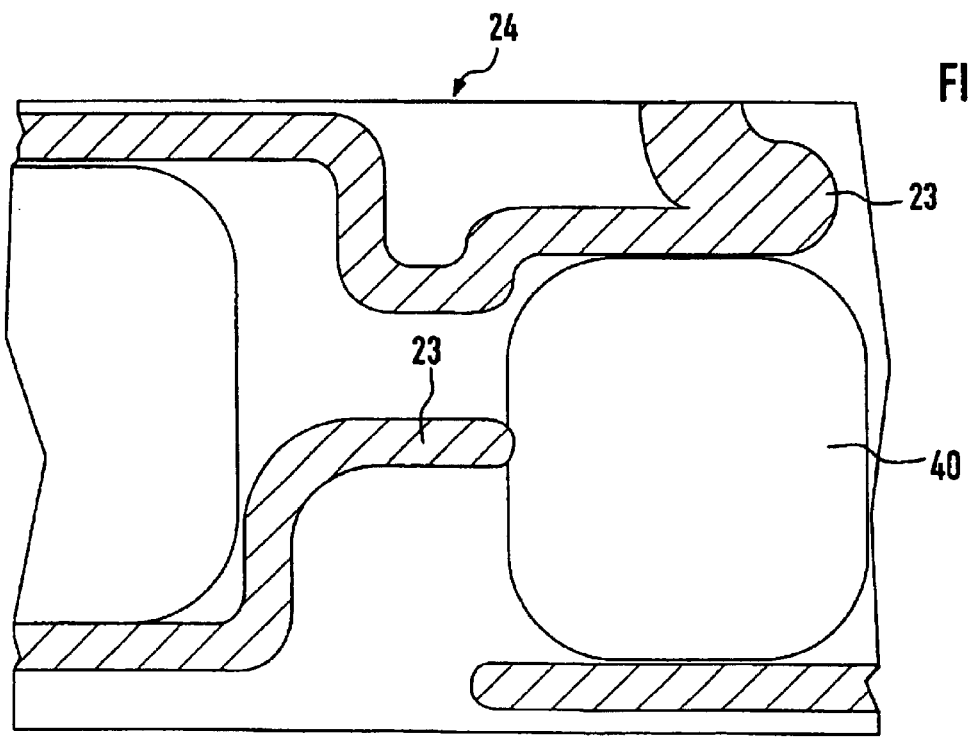
FIG. 4 illustrates a cover with strips of conductive paste according to the second step of the manufacturing method.

FIG. 4 shows conductive cover 24 after the second step of the method. This step consists in depositing strips of conductive paste 23 on conductive cover 24 on places to be put in contact with the lines of metallized holes 221, 224 (FIG. 3). Conductive cover 24 is preferably flat so that the application of strips of conductive paste 23 on cover 24 can easily be automated without requiring high precision tools. In a preferred embodiment cavities 40 can be manufactd in cover 24 over microwave circuits 11, 12 (FIG. 3).

In a further step of the method for manufacturing integrated microwave modules according to the invention, conductive cover 24 shown in FIG. 4 is assembled with the other part of the integrated microwave module shown in FIG. 3. Preferably, a low press is applied on conductive cover against the other part of the integrated microwave module for obtaining a predefined distance between the top of the non-conductive substrate and the conductive cover and at the same time improving the electrical contact between the cover 24, the strips of conductive paste 23 and the lines of metallized holes 221, . . . 224.

Preferably, the conductive paste contains substances which stick cover 24 to the lines of metallized holes. Moreover, the conductive paste contains advantageously hardening substances so that the thickness of the strips of conductive paste remains constant especially after the press has been applied on cover 24 to establish a better electrical contact. A possible material used as conductive paste is the silver-copper alloy "Choform bis AgCu" from the company Acofab. Other materials having equivalent behaviors, as for example glue containing silver particles, can of course be used as will be clear for a person skilled in the art.

Figure 5:
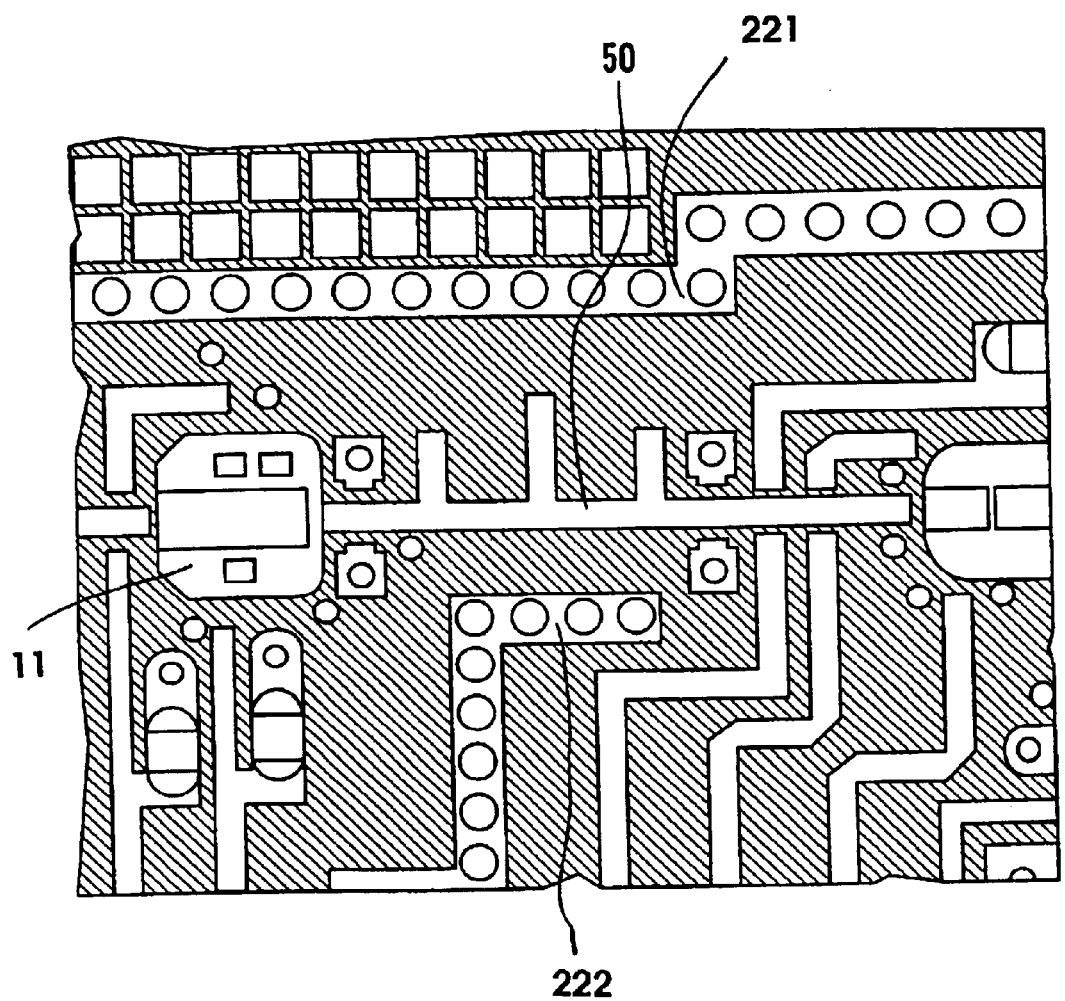
FIG. 5 illustrates a part of an integrated microwave module using a microstrip filter.

FIG. 5 illustrates an integated microwave module without cover where transmission line 13 of FIGS. 1 and 3 is replaced by a microstrip filter 50 designed on substrate 21 (FIGS. 2b and 2c) between the two lines of metallized holes 221, 222 and preventing the propagation of a predefined frequency band lower than said cutoff frequency in substrate 21.

FIG. 5 illustrates an integated microwave module without a cover where transmission line 13 of FIGS. 1 and 3 is replaced by a microstrip filter 50 designed on substrate 21 (FIGS. 2b and 2c) between the two lines of metallized holes 221, 222 and preventing the propagation of a predefined frequency band lower than said cutoff frequency in substrate 21.

I claim:

1. Integrated microwave module comprising a conductive around plane, a non-conductive substrate on said around plane, at least two microwave circuits mounted on said substrate, a transmission line mounted on said substrate between said microwave circuits, and a conductive cover closing said integrated microwave module, wherein:

said substrate comprises lines of metallized holes along said transmission line on both sides of said transmission line; and respective strips of conductive paste are disposed between said lines of metallized holes and said conductive cover, wherein said lines of metallized holes are parallel to each other and separated by a length spacing, said conductive ground plane and a surface of said conductive cover being parallel to each other and separated by a width spacing, wherein said width and length represent the dimensions of a cross section of a virtual rectangular waveguide which encloses said transmission line, and which is limited by said conductive ground plane, said lines of metallized holes, said strips of conductive paste and said conductive cover, said width and length being such that said virtual rectangular waveguide presents a cutoff frequency at a predefined frequency value, and wherein said transmission line prevents propagation, in said substrate, of unwanted frequencies above said cutoff frequency.

2. The integrated microwave module according to claim 1, wherein said predefined frequency value is higher than a passband of said transmission line, thereby preventing propagation of unwanted frequencies in said module.

3. The integrated microwave module according to claim 1, wherein said conductive paste comprises a substance, which sticks said cover to said lines of metallized holes, and a hardening substance which maintains a constant thickness of said strips of conductive paste.

4. Integrated microwave module according to claim 1, wherein the respective distance between rims of two consecutive holes of each of said lines of metallized holes depends on said predefined value of said cutoff frequency.

5. Integrated microwave module according to claim 1, wherein the surface of said conductive cover disposed over said strips of conductive paste is flat.

6. An integrated microwave module comprising a conductive ground plane, a non-conductive substrate on said ground plane, at least two microwave circuits mounted on said substrate, a microstrip filter mounted on said substrate between said microwave circuits, and a conductive cover closing said integrated microwave module, wherein:

said substrate comprises lines of metallized holes along said microstrip filter on both sides of said microstrip filter;

respective strips of conductive paste are disposed between said lines of metallized holes and said conductive cover;

said lines of metallized holes are parallel to each other and separated by a length spacing, said conductive ground plane and a surface of said conductive cover being parallel to each other and separated by a width spacing;

said width and length represent the dimensions of a cross section of a virtual rectangular waveguide which encloses said microstrip filter, and which is limited by said conductive ground plane, said lines of metallized holes, said strips of conductive paste and said conductive cover, said width and length being chosen so that said virtual rectangular waveguide presents a cutoff frequency at a predefined frequency value; and said microstrip filter prevents propagation, in said substrate, of unwanted frequencies above said cutoff frequency.

7. Integrated microwave module according to claim 6, wherein the surface of said conductive cover disposed over said strips of conductive paste is flat.

8. Integrated microwave module according to claim 6, wherein the respective distance between rims of two consecutive holes of each of said lines of metallized holes depends on said predefined value of said cutoff frequency.

9. The integrated microwave module according to claim 6, wherein said conductive paste comprises a substance, which sticks said cover to said lines of metallized holes, and a hardening substance which maintains a constant thickness of said strips of conductive paste.

10. The integrated microwave module according to claim 6, wherein said predefined frequency value is higher than a passband of said microstrip filter, thereby preventing propagation of unwanted frequencies in said module.

* * * * *